(12) United States Patent
Sanjeevarao et al.

(10) Patent No.: US 10,573,364 B1
(45) Date of Patent: Feb. 25, 2020

(54) MAGNETIC DISTURB DIAGNOSTIC SYSTEM FOR MRAM

(71) Applicant: NXP USA, Inc., Austin, TX (US)

(72) Inventors: Padmaraj Sanjeevarao, Austin, TX (US); Richard Eguchi, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/219,264

(22) Filed: Dec. 13, 2018

(51) Int. Cl.
*G11C 11/00* (2006.01)
*G11C 11/16* (2006.01)
*G01R 33/09* (2006.01)

(52) U.S. Cl.
CPC .......... *G11C 11/1673* (2013.01); *G01R 33/09* (2013.01); *G11C 11/1659* (2013.01); *G11C 11/1675* (2013.01)

(58) Field of Classification Search
CPC ............ G11C 11/1673; G11C 11/1659; G11C 11/1675; G01R 33/09
USPC ......................................... 365/158, 200, 201
See application file for complete search history.

(56) References Cited

U.S. PATENT DOCUMENTS

| | | | |
|---|---|---|---|
| 8,437,180 B2 * | 5/2013 | Higo | G11C 11/161 365/148 |
| 8,848,431 B2 | 9/2014 | Katti et al. | |
| 9,228,855 B2 | 1/2016 | Cambou et al. | |
| 10,234,347 B1 * | 3/2019 | Khizroev | G01L 1/247 |
| 2005/0180239 A1 * | 8/2005 | Tsang | G11C 11/16 365/213 |
| 2014/0139209 A1 | 5/2014 | Lee et al. | |
| 2016/0196951 A1 * | 7/2016 | Ohsawa | H01J 37/30 250/492.3 |
| 2017/0059669 A1 | 3/2017 | Kan et al. | |
| 2017/0365357 A1 * | 12/2017 | Kobayashi | G11C 11/161 |
| 2018/0004602 A1 * | 1/2018 | Chih | H03M 13/2906 |
| 2019/0035449 A1 * | 1/2019 | Saida | G11C 11/1673 |

OTHER PUBLICATIONS

Casanova, Joaquin J. et al; "Transmitting Coil Achieving Uniform Magnetic Field Distribution for Planar Wireless Power Transfer System"; 2009 IEEE Radio and Wireless Symposium, San Diego, CA, USA; 4 pages (May 9, 2009).

* cited by examiner

*Primary Examiner* — Viet Q Nguyen

(57) ABSTRACT

Embodiments of a magnetoresistive random access memory (MRAM) diagnostic system are provided, which includes: preconditioning all bit cells in an MRAM cell array to a data value of one during a diagnostic mode, wherein the MRAM cell array is implemented in an active side of a semiconductor substrate; applying a first magnetic disturb field having a predetermined field strength to the MRAM cell array, subsequent to the preconditioning, wherein the first magnetic disturb field is generated by an antenna implemented in a number of layers of conductive and dielectric material over the active side of the semiconductor substrate; performing a first error correcting code (ECC) read operation to read the MRAM cell array, subsequent to the applying the first magnetic disturb field; and in response to detecting at least one uncorrectable read during the first ECC read operation, setting a fail state and exiting the diagnostic mode.

20 Claims, 5 Drawing Sheets

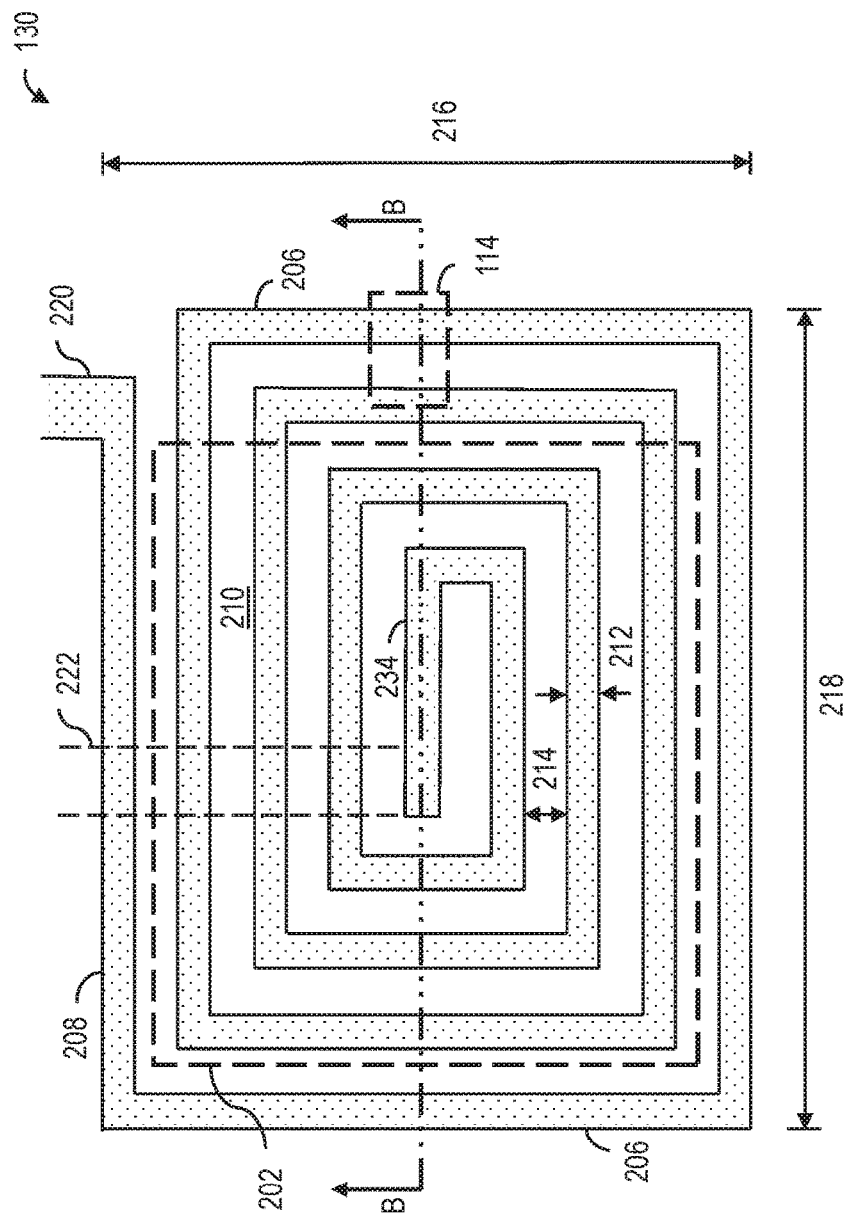
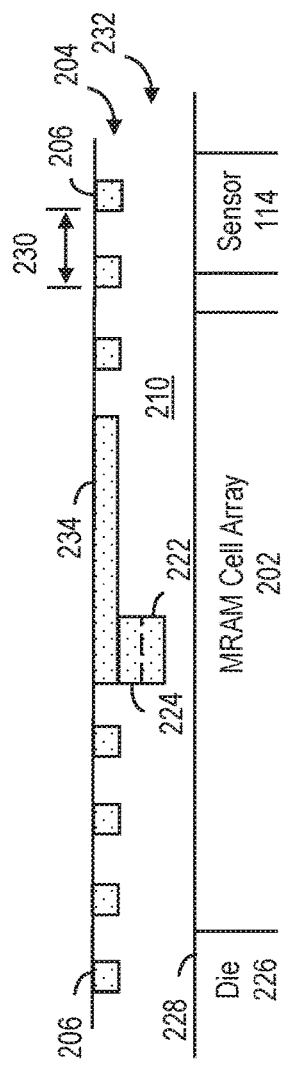
FIG. 2A
FIG. 2B

US 10,573,364 B1

MAGNETIC DISTURB DIAGNOSTIC SYSTEM FOR MRAM

BACKGROUND

Field

This disclosure relates generally to magnetoresistive random access memory (MRAM) systems, and more specifically, to a diagnostic system using magnetic disturb fields for MRAM.

Related Art

In contrast to Random Access Memory (RAM) technologies that use electric charges to store data, MRAM is a memory technology that uses magnetic polarization to store data. One primary benefit of MRAM is that it retains the stored data in the absence of applied system power, making it a non-volatile memory suitable for implementation in a variety of devices. While MRAM technology productization is relatively new and developing, the technology has significant application opportunities.

BRIEF DESCRIPTION OF THE DRAWINGS

The present invention may be better understood, and its numerous objects, features, and advantages made apparent to those skilled in the art by referencing the accompanying drawings.

FIGS. 2A and 2B are block diagrams depicting example components of the MRAM magnetic disturb diagnostic system implemented on a semiconductor substrate, according to some embodiments of the present disclosure.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

Generally, a magnetoresistive random access memory (MRAM) includes a large number of magnetic bit cells formed on a semiconductor substrate, where each cell represents one data bit. Information is written to a bit cell by changing the magnetization direction of a magnetic element within the bit cell, and a bit cell is read by measuring the resistance of the bit cell (e.g., low resistance typically represents a "0" bit and high resistance typically represents a "1" bit). The bit cells are programmed using programming lines, often called bit lines and digit (or word) lines.

One drawback to a memory array implemented using MRAM cells is the lack of immunity to magnetic fields in the ambient environment, which may corrupt the data value stored by a number of magnetic bit cells. Managing potential latent read failures is a large hurdle to enable MRAM for mainstream applications.

The present disclosure provides a diagnostic system configured to identify imminent read failures in an MRAM cell array by applying a magnetic disturb field having a predetermined field strength that is strong enough to disturb any latent weak bits in the MRAM cell array, and looking for uncorrectable read locations, such as by using an error correcting code (ECC) read operation. In response to detecting any uncorrectable reads, the diagnostic system may then take evasive actions to prevent a catastrophic application failure, such as retiring the sector, word, or location with the read failure. The diagnostic system improves reliability and performance of the MRAM cell array.

Example Embodiments

Figure 1:
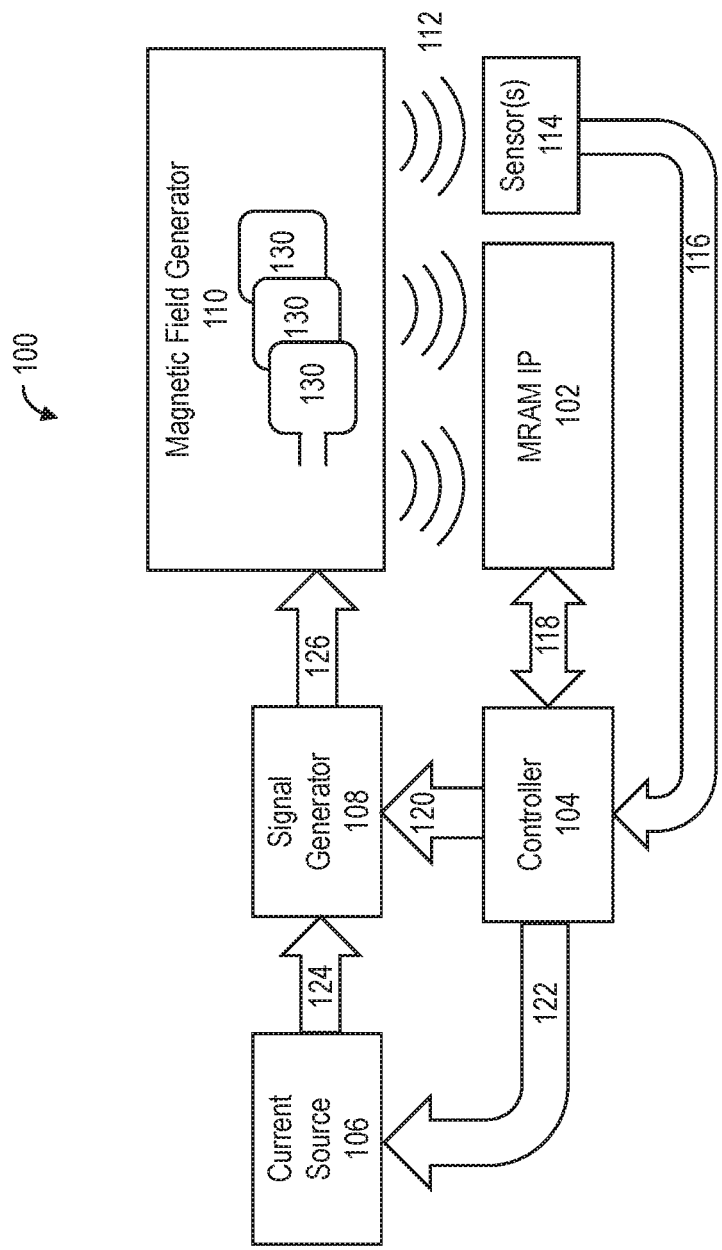
FIG. 1 is a block diagram depicting an example MRAM magnetic disturb diagnostic system, according to some embodiments of the present disclosure.

FIG. 1 shows an example magnetoresistive random access memory (MRAM) magnetic disturb diagnostic system 100 (or MRAM diagnostic system 100), which includes MRAM IP block 102, controller 104, current source 106, signal generator 108, magnetic field generator 110, and one or more sensors 114, as further discussed below.

Figure 3A:
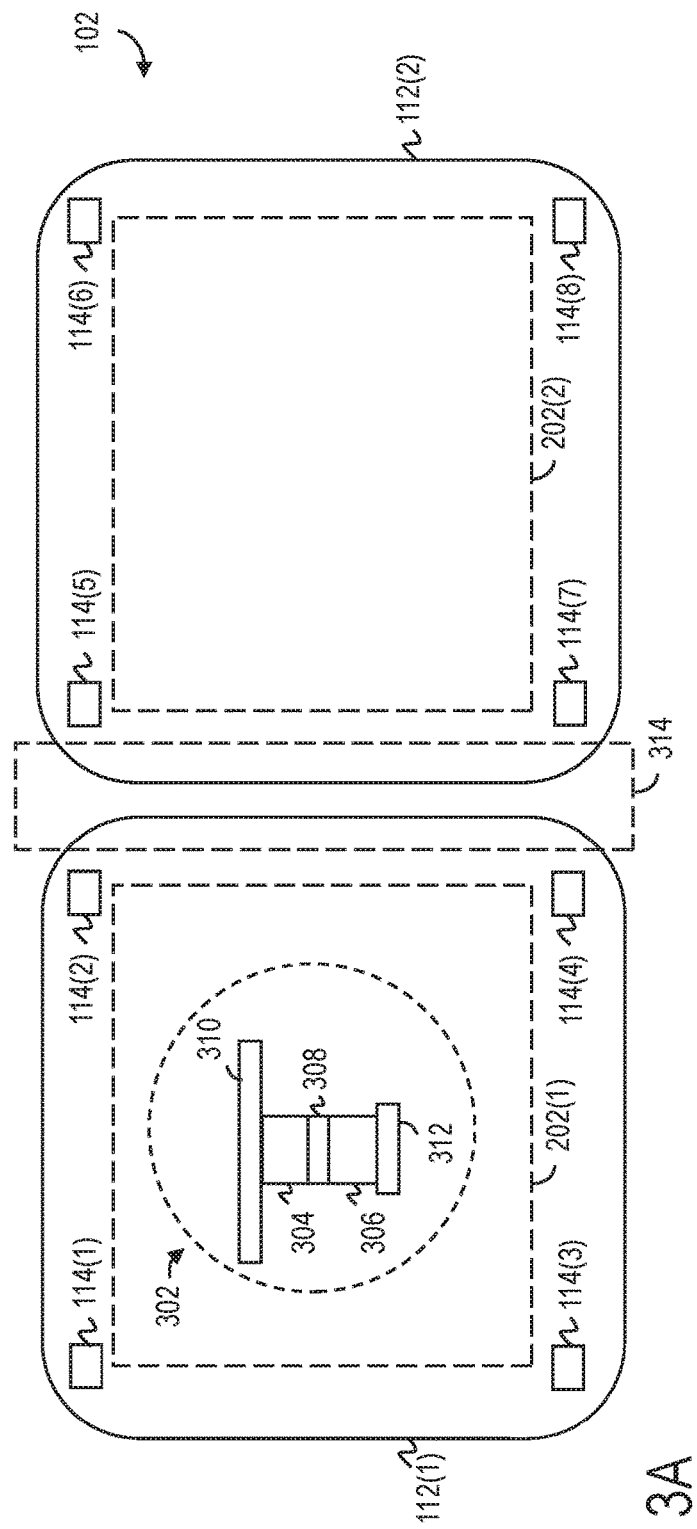
FIGS. 3A and 3B are block diagrams depicting example components of the MRAM magnetic disturb diagnostic system implemented for two or more MRAM cell arrays, according to some embodiments of the present disclosure.

MRAM IP block 102 includes an array of MRAM bit cells, also referred to as an MRAM cell array, as well as access circuitry for reading from and writing to the MRAM cell array, which are further discussed below in connection with FIG. 3A. In some embodiments, an MRAM cell array may be divided into one or more sub-arrays, an example of which is also shown in FIG. 3A. In some embodiments, MRAM IP block 102 also includes a memory controller configured to receive read and write requests and to control the access circuitry for implementing read and write operations. The MRAM memory controller may also be configured to receive data to be written into the MRAM cell array, as well as provide any data read from the MRAM cell array. MRAM bit cells may see degradation in magnetic immunity through usage (e.g., write cycling), where latent weaker bits are more prone to bit flips or disturbs.

Controller 104 implements a diagnostic system controller that is configured to control current source 106 and signal generator 108 to generate a current signal 126 suitable for generating a magnetic disturb field 112 by magnetic field generator 110, which is used to determine weak bits in an MRAM cell array. In some embodiments, controller 104 has bidirectional communication 118 with the MRAM memory controller. During a diagnostic mode, controller 104 is configured to communicate with the MRAM memory controller in order for a predetermined value (e.g., 1 or 0) to be written to every bit cell in the MRAM cell array. Controller 104 is also configured to trigger generation of a magnetic disturb field (e.g., positive or negative) at a predetermined field strength that is applied to the MRAM cell array. Controller 104 is also configured to communicate with the MRAM memory controller in order for every bit cell in the MRAM cell array to be read to determine whether any bit flips have occurred. In some embodiments, the MRAM memory controller is configured to implement an error correcting code (ECC) read operation, which is capable of detecting and correcting bit errors, the number of which depends on the correction scheme implemented by the ECC. In the event that a bit error cannot be corrected, the MRAM memory controller sets a failure flag to indicate that an uncorrectable bit has been detected. If no uncorrectable bits have been detected, the diagnostic mode successfully ends. In some embodiments, controller 104 may include the functionality of both the diagnostic system controller and the MRAM memory controller, where controller 104 has further bidirectional communication 118 with the MRAM cell array via the access circuitry.

Controller 104 is configured to output one or more control signals 122 to current source 106, which may include an enable signal that turns current source 106 on (e.g., enables) during the diagnostic mode and off (e.g., disables) during operational mode, and a current level selection signal that indicates a desired level of current. When enabled, current source 106 is configured to output a reference current signal 124 at some constant DC (direct current) level, according to the current level selection signal. In some embodiments, current source 106 is a voltage-controlled current source that provides the reference current signal 124 based on an input voltage signal provided by a variable voltage source. The current level selection signal from controller 104 may be a digital control signal that controls the voltage output of the variable voltage source, which in turn controls the DC level of the reference current signal 124.

Controller 104 is also configured to output one or more control signals 120 to signal generator 108, which may include an enable signal that turns signal generator 108 on during the diagnostic mode and off during operational mode. When enabled, signal generator 108 is configured to generate a current signal 126 based on the reference current signal 124. In some embodiments, signal generator 108 may include circuitry that implements a predetermined duty cycle to form pulses at a predetermined frequency. The duty cycle of a signal indicates a fraction of one period in which the signal is active, where one period is the time in which it takes the signal to complete an on-and-off cycle. Duty cycle may be expressed as a percentage or ratio. For example, a 40% duty cycle indicates the signal is on for 40% of the period, and off for the remaining time, forming a pulse. Frequency of a signal indicates the number of periods per unit of time. By implementing the predetermined duty cycle, the amount of current that the magnetic field generator can reliably handle is increased by a factor of 10, relative to DC current excitation. The predetermined frequency and predetermined duty cycle are selected to achieve a current signal 126 suitable for generating a magnetic disturb field 112.

Magnetic field generator 110 includes one or more antennas 130, where the current signal 126 is driven on each antenna 130 to generate a magnetic disturb field 112. In some embodiments, signal generator 108 may optionally include one or more amplifiers to drive the current signal 126 on each of the antennas 130. Each antenna 130 may be a coil or other suitably shaped antenna configured to produce a substantially uniform magnetic disturb field 112 that passes through at least a portion of the bit cells in the MRAM cell array in MRAM IP block 102, as further discussed below.

The one or more control signals 120 to signal generator 108 may also include a direction indicator signal that indicates a desired direction of the current through the one or more antennas 130. For example, each antenna may include two electrodes or lines, where the current signal 126 is applied to a first antenna electrode, while a negative power supply voltage (e.g., ground) is applied to the second antenna electrode. Signal generator 108 may include a switching circuit of one or more switches or suitable devices for changing the direction of the current, where the current signal 126 is applied to the second antenna electrode, while the first antenna electrode is grounded. By changing the direction of the current, the polarity of the magnetic field (e.g., positive or negative) can be changed.

One or more sensors 114 may also be positioned closely around the MRAM cell array in order to detect a field strength of the magnetic disturb field 112. Each sensor 114 may be a Hall effect sensor, which is a transducer that varies its output voltage 116 in response to a magnetic flux of the field 112 passing through the sensor. In some embodiments, the output voltage 116 of the sensor 114 may change linearly depending on magnetic flux density, where the output voltage 116 generally increases as the field strength of the magnetic disturb field 112 increases. In other embodiments, the output voltage 116 may change sharply at a predetermined threshold of magnetic flux density that corresponds to a magnetic disturb field 112 at a predetermined level of field strength.

Controller 104 is configured to receive the output voltage 116 of the one or more sensors 114, and to adjust the field strength of the magnetic disturb field 112 accordingly. For example, based on values of one or more output voltages 116 of one or more sensors 114, controller 104 may determine that the magnetic disturb field 112 needs to be strengthened and increases the reference current signal 124 accordingly, such as by providing a current level selection signal of control signal 122 that increases the DC level of the reference current signal 124. Similarly, controller 104 may reduce the field strength of the field 112 by reducing the DC level of the reference current signal 124. Controller 104 may also determine that the field strength is adequate and in response, holds the magnetic disturb field 112 for some short amount of time to disturb the bit cells. Examples of a system implementing one or more sensors near the MRAM cell array are shown in FIGS. 2A and 3A, discussed below.

In some embodiments, only one sensor 114 may be needed to calibrate the magnetic disturb field 112, which is paired with a smaller antenna 130 implemented as a dedicated calibration antenna. The smaller antenna 130 produces a magnetic field representative of the magnetic disturb field 112, and the single sensor 114 provides feedback to controller 104. Controller 104 may then calibrate the magnetic disturb field 112 based on the field output by the smaller antenna 130. In such embodiments, signal generator 108 may also include a signal splitter or other device to provide a portion of current signal 126 to the dedicated calibration antenna. An example of a dedicated calibration antenna is shown in FIG. 5A, discussed below.

FIG. 2A is a top-down view of an x-y plane and FIG. 2B is a cross-sectional view in the z-direction showing detail of an example coil antenna 130 implemented in the vicinity of an MRAM cell array 202. As shown in FIG. 2B, MRAM cell array 202 and sensor 114 are implemented on an active side 228 of die 226, which may also include other active circuitry. Die 226 may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As also shown in FIG. 2B, antenna 130 is positioned over MRAM cell array 202 and is implemented in a number of conductive and dielectric layers formed over the active side 228 of die 226. As shown in FIG. 2A, antenna 130 includes several windings implemented in the x-y plane of a patterned conductive layer 204. In the embodiment shown, antenna 130 has a rectangular shape, where the windings are implemented with a number of serially-connected vertical portions 206 and horizontal portions 208 of conductive layer 204, relative to FIG. 2A. As used herein, "vertical" generally indicates a top-to-bottom direction and "horizontal" generally indicates a side-to-side direction, relative to the drawing. In other embodiments, antenna 130 may have different coil shapes, such as circular, oval, triangular, polygonal, or other irregular shape implemented by curved, straight, or irregularly shaped portions of conductive layer 204. Conductive layer 204 may be formed from electrically conductive material, examples of which include but are not limited to nickel, gold, copper, aluminum, or other suitable conductive metal or alloy composed of one or more suitable conductive metals.

The portions of conductive layer 204 (such as portions 206 and 208) each have a width 212 and a thickness based on the thickness of the conductive layer 204. The portions are laterally separated from one another by a spacing 214 to form the coil shape (e.g., vertical portions 206 are laterally separated from other vertical portions 206, and horizontal portions 208 are laterally separated from other horizontal portions 208). Generally, the width 212 should be large enough to handle the current signal 126 to induce the magnetic disturb field 112 without overheating or otherwise damaging the MRAM cell array 202. In some embodiments, thicker conductive layers may be used to form the antenna 130, which increases the amount of current that the antenna can handle and enables the antenna to produce stronger magnetic disturb fields 112. Each spacing 214 between the portions is filled with dielectric material 210. Dielectric material 210 may be formed from an insulating material, examples of which may include but are not limited to silicon oxide, silicon nitride, silicon dioxide, silicon oxynitride, polyimide, other suitable materials including oxides, nitrides, and the like.

The windings of antenna 130 are implemented in conductive layer 204 according to a coil pitch 230, where the pitch 230 is equal to the width 212 plus the spacing 214. In the embodiment shown in FIG. 2B, width 212 and spacing 214 are uniform, providing a uniform pitch 230. In some embodiments, a minimum pitch of 37 um (or microns) may be achieved, such as in an embodiment that implements a minimum width 212 of 35 um and a minimum spacing 214 of 2 um. By minimizing the pitch 230, the number of windings is increased, which enables antenna 130 to generate stronger magnetic disturb fields 112. In other embodiments, the width 212 is equal to the spacing 214, providing a pitch 230 of 70 um. In some embodiments, the width 212 and spacing 214 may be selected to achieve a desired pitch-to-width ratio of 2:1.

Figure 3B:
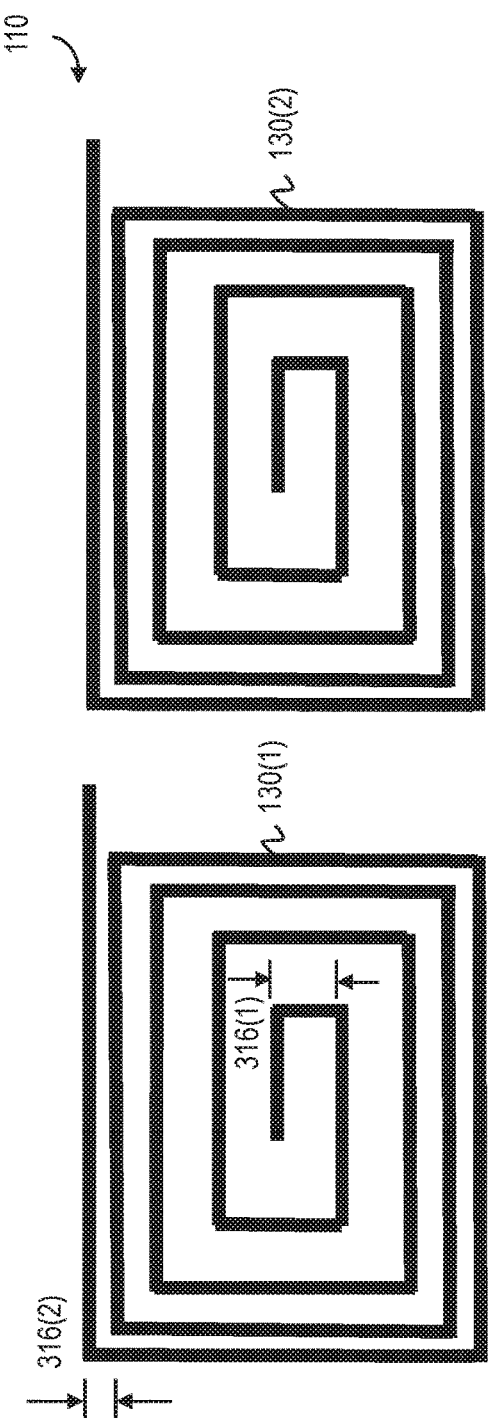

Coil pitch 230 may also be optimized to obtain a more uniform field across the MRAM cell array 202, such as by implementing a graded pitch, or pitch that changes from the center of the antenna to the periphery of the antenna, like that shown in FIG. 3B. In such embodiments, the width 212 of the portions may vary, the size of the spacings 214 may vary, or both. For example, the widths of the portions nearer the center of the antenna 130 may be smaller than the widths of the portions nearer the periphery of the antenna 130, or the widths of the portions nearer the center of the antenna 130 may be larger than the widths of the portions nearer the periphery of the antenna 130. Similarly, the spacings between the portions nearer the center of the antenna 130 may be smaller than the spacings between the portions nearer the periphery of the antenna 130, or the spacings between the portions nearer the center of the antenna 130 may be larger than the spacings between the portions nearer the periphery of the antenna 130.

Antenna 130 has two electrodes or lines 220 and 222. As shown in FIG. 2B, electrode 222 is implemented in another conductive layer 232 underneath conductive layer 204 and vertically separated from the windings in layer 204 by dielectric material 210 (e.g., vertical relative to FIG. 2B). A via 224 or other connection is formed as part of a center portion 234 (which may be a vertical or horizontal portion 206 or 208, relative to FIG. 2A) in conductive layer 204, electrically contacting electrode 222. Electrodes 220 and 222 are configured to receive either the current signal 126 or negative power supply signal (such as ground), depending on the switch setting in signal generator 108. For example, electrode 220 may be coupled to the current signal 126 (e.g., through an amplifier in some embodiments) and electrode 222 may be coupled to ground, which drives the current signal 126 through the antenna 130 in a first direction to produce a first polarity magnetic disturb field. The current signal 126 and ground signal may be switched to electrodes 222 and 220, respectively, which drives the current signal 126 through the antenna 130 in a second direction opposite the first direction, producing a second polarity magnetic disturb field, where the second polarity is opposite the first polarity. When driven with current signal 126, antenna 130 generates a magnetic disturb field in the z-direction (or in the vertical direction relative to FIG. 2B), which may be directed in an up or down z-direction, depending on the field's polarity.

MRAM cell array 202 has an outer perimeter within which the MRAM bit cells are located, as indicated by dashed outline in FIG. 2A. Antenna 130 has a footprint (or area) within which the windings of the antenna 130 are contained, which generally corresponds to an overall length 218 and an overall width 216. While windings of antenna 130 generate a substantially uniform magnetic disturb field 112 within the footprint, the magnetic field strength of the field 112 is dependent on the distance from the antenna 130, which generally decreases or drops off as distance increases. In the embodiment shown, the footprint of antenna 130 is greater than the outer perimeter of MRAM cell array 202, which may be preferred to ensure that the magnetic disturb field 112 delivers a desired magnetic field strength to all bit cells in array 202. For example, the footprint of the antenna 130 may be 600 um by 600 um. In other embodiments, the footprint of antenna 130 is smaller than the outer perimeter of MRAM cell array 202, but the magnetic disturb field 112 is strong enough to deliver at least a minimum magnetic field strength to all bit cells in array 202, including those bit cells located outside of the antenna's footprint. In both types of embodiments, antenna 130 exposes the bit cells to a magnetic disturb field 112 that may be adjusted by controller 104 to be strong enough to disturb latent weak bits, as further discussed below.

In the embodiment shown, sensor 114 is laterally adjacent to a side of MRAM cell array 202, while in other embodiments, sensor 114 may be laterally adjacent to a corner of MRAM cell array 202 (like that shown in FIG. 3A). In the embodiment shown, sensor 114 has an outer perimeter (shown in dashed outline in FIG. 2A) that at least partially falls within the footprint of antenna 130, which may be preferred to ensure that the sensor 114 receives a magnetic field strength comparable to the magnetic field strength received by the bit cells of array 202 (or at least comparable to the bit cells on the outer edges of array 202). In other embodiments, the outer perimeter of sensor 114 may fall outside of the footprint of antenna 130 (but is close enough to the antenna 130 for proper calibration of the magnetic disturb field 112), where sensor 114 receives a diminished amount of the magnetic field strength of the magnetic disturb field 112. In both types of embodiments, sensor 114 indicates a field strength of the magnetic disturb field 112 at that sensor's location to controller 104. Controller 104 then determines whether the field strength of the magnetic disturb field 112 should be increased or decreased in order to achieve a minimum magnetic field strength at the sensor's location, which ensures that the bit cells of the MRAM cell array located closer to the antenna 130 are receiving a desired field strength greater than the minimum field strength.

While the magnetic disturb field 112 is substantially uniform, the magnetic field strength of field 112 may vary across the MRAM cell array, depending on the antenna implementation. For example, bit cells located in close vicinity to the conductive windings (e.g., directly underneath a conductive portion) may receive a greater field strength than those bit cells located between the windings (e.g., directly underneath dielectric material). Additionally, the magnetic field strength of the field 112 decreases as the distance from the antenna 130 increases. Accordingly, the magnetic field strength may be viewed as having a normal distribution curve (e.g., a bell curve). Generally, the magnetic disturb field 112 should have a minimum magnetic field strength of magnitude 100 Oe at the tail ends of the distribution, which is strong enough to cause latent weak bits to flip. The peak of the distribution may have a magnetic field strength of magnitude 500 Oe or greater, depending on the antenna implementation and the current signal used to drive the antenna.

It is also noted that the magnetic disturb field 112 is generated for a short amount of time that is at least long enough to flip a weak bit, such as on the order of microseconds to milliseconds. This allows for a larger current to be driven on the antenna 130 than would normally be provided (e.g., driving the larger current for longer amounts of time may result in overheating or breakdown), which may generate a stronger magnetic disturb field 112. However, the width 212 of the antenna's coil may still limit the amount of current that can be safely handled by the antenna 130. For example, a width of 4 um may limit the antenna 130 to handle approximately 48 mA of current, while a width of 35 um may have a larger limit of approximately 1680 mA. The number of windings or loops implemented in the antenna 130 also affects the field strength of the magnetic disturb field 112, where each loop effectively acts as a multiplier of the magnetic field strength.

FIG. 3A is a top-down view of an MRAM IP block 102 that includes an MRAM cell array that implements two sub-arrays 202(1) and 202(2), and FIG. 3B is a top-down view of an example magnetic field generator 110 that includes two antennas 130(1) and 130(2) that are configured to respectively overlay sub-arrays 202(1) and 202(2). While two sub-arrays 202(1)-(2) and two antennas 130(1)-(2) are shown, additional sub-arrays 202 with corresponding antennas 130 may be implemented in other embodiments.

A simplified MRAM bit cell 302 of an MRAM array 202 is shown within the dashed circle of FIG. 3A. MRAM bit cell 302 includes a magnetic tunnel junction (MTJ) core formed by a first ferromagnetic layer 304, a second ferromagnetic layer 306, and an insulating layer 308 between layers 304 and 306. The MTJ core is connected between a top electrode 310 and a bottom electrode 312, which may be metal lines that run perpendicular to one another. In this example, the first ferromagnetic layer 304 may be a free magnetic layer because the direction of its magnetization may be switched to change the bit status of bit cell 302, and the second ferromagnetic layer 306 may be a fixed magnetic layer because the direction of its magnetization is configured not to rotate or change directions with normal write fields. The resistance across bit cell 302 is lower when the magnetization in first ferromagnetic layer 304 is parallel to the magnetization in the second ferromagnetic layer 306, as compared to the resistance when the magnetization in the first ferromagnetic layer 304 is anti-parallel to the magnetization in the second ferromagnetic layer 306. The data (e.g., 0 or 1) is determined by measuring the resistance of the bit cell 302.

MRAM IP block 102 also includes access circuitry 314 for reading from and writing to each bit cell 302, which may include a number of conductive lines, often called bit lines and digit or word lines, that are electrically connected or coupled to the electrodes of each MRAM cell 302. The access circuitry 314 may also include additional circuitry, such as an isolation transistor for each bit cell, sense amplifiers for reading the bit cells, and programming circuitry for writing to the bit cells.

In the embodiment shown, four sensors 114(1)-(4) are implemented at the corners of sub-array 202(1), and four sensors 114(5)-(8) are implemented at the corners of sub-array 202(2). Antenna 130(1) is formed over sub-array 202(1), and antenna 130(2) is formed over sub-array 202(2), in a manner similar to that shown in FIGS. 2A and 2B. Antenna 130(1) generates field 112(1) that passes through the bit cells of sub-array 202(1) and sensors 114(1)-(4), and antenna 130(2) generates field 112(2) that passes through the bit cells of sub-array 202(2) and sensors 114(5)-(8). Each sensor 114 provides feedback to controller 104 to ensure that all bit cells within each sub-array 202 are respectively receiving the fields 112(1)-(2) at a sufficient strength for disturbing weak bits.

It is noted that the antennas 130(1)-(2) are implemented with a graded pitch 316, where a larger pitch 316(1) is implemented near the center of antennas 130(1)-(2) and a smaller pitch 316(2) is implemented near the periphery of antennas 130(1)-(2). Both antennas 130(1)-(2) produce a substantially uniform magnetic disturb field 112, where a minimum magnetic field strength is delivered to all bit cells of sub-arrays 202(1)-(2). Differently sized pitches and widths may be implemented in other embodiments. For example, the antenna 130 having the shape shown in FIG. 2A may be implemented for each sub-array 202(1)-(2) instead of antennas 130(1)-(2) having graded pitch.

Figure 5B:
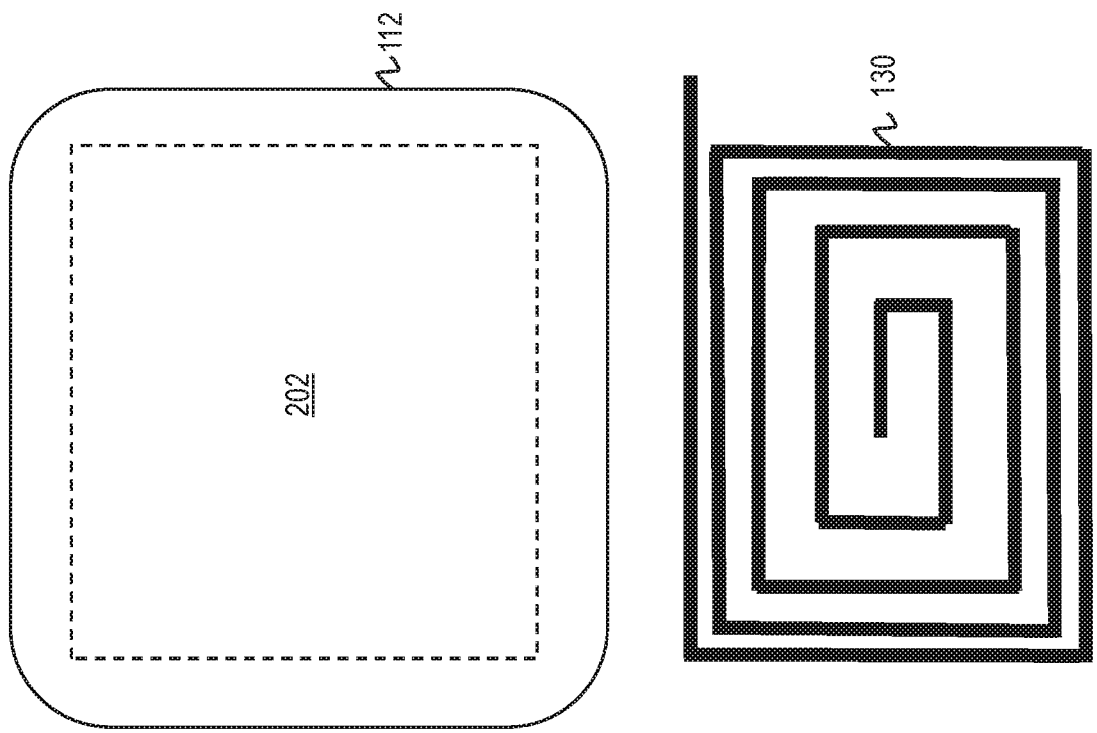
FIGS. 5A and 5B are block diagrams depicting example dedicated calibration components of the MRAM magnetic disturb diagnostic system, according to some embodiments of the present disclosure.
Figure 5A:
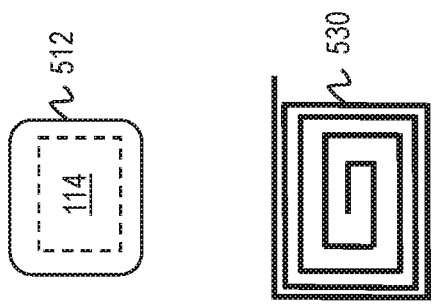

FIG. 5A shows a top-down view of an example dedicated calibration antenna 530 and its corresponding magnetic field 512, and FIG. 5B shows a top-down view of an example antenna 130 and its corresponding magnetic disturb field 112. Antenna 530 may be implemented in magnetic field generator 110 to perform calibration of the magnetic disturb field 112, without needing to place one or more sensors 114 in close vicinity of the MRAM cell array 202. As shown, antenna 530 is a replica of the one or more antennas 130 used to generate magnetic disturb field 112(1). Antenna 530 is positioned over a dedicated calibration sensor 114 to expose the sensor 114 to magnetic field 512, while antenna 130 is positioned over MRAM cell array 202 to expose the array 202 to magnetic disturb field 112. While a single array 202 is shown in FIG. 5A, the MRAM cell array may include several sub-arrays, each sub-array having a respective antenna 130 like that shown in FIGS. 3A and 3B.

Antenna 530 is configured to receive at least a portion of the current signal 126 that is provided to antenna 130. Antenna 530 is configured to generate a magnetic field 512 that is received by sensor 114. The field strength of the magnetic field 512 is proportional to the field strength of the magnetic disturb field 112 generated by antenna 130, based on a predetermined ratio between the portion of the current signal 126 and the full current signal 126 implemented by the signal generator 108 (e.g., implemented by a signal splitter or other circuitry in signal generator 108). Controller 104 is configured to receive the output voltage from sensor 114 and determine whether the magnetic field strength of field 112 should be increased, decreased, or held, based on the magnetic field strength of field 512.

Figure 4:
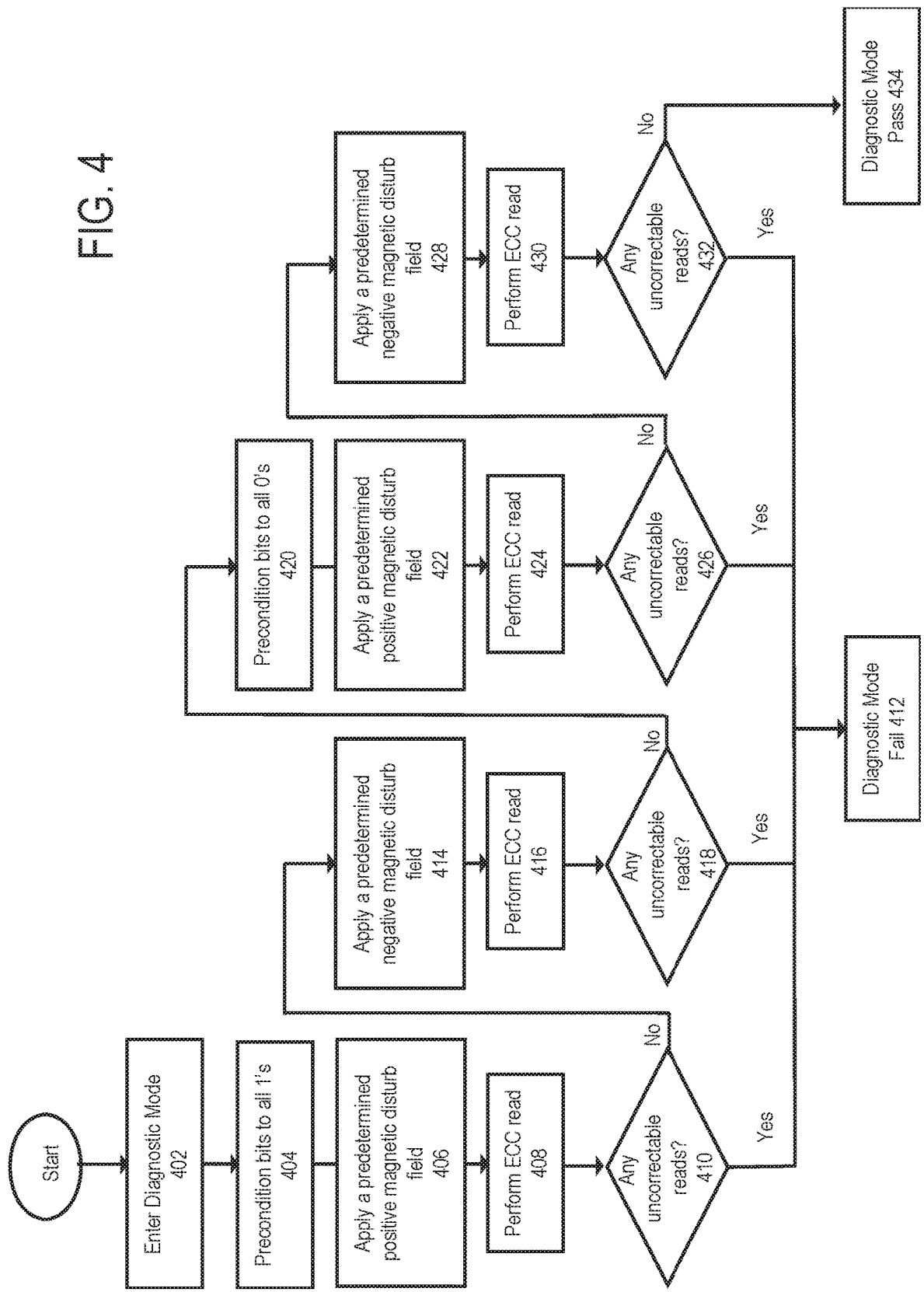
FIG. 4 is a flowchart depicting an example diagnostic process implemented by the MRAM magnetic disturb diagnostic system, according to some embodiments of the present disclosure.

FIG. 4 is a flowchart depicting an example diagnostic process implemented by the MRAM diagnostic system 100. For example, controller 104 may trigger the operations of the diagnostic process, which are then implemented by various components of the MRAM diagnostic system 100. Any of the above embodiments of system 100 may implement the process. The process may be triggered on startup or reset of the MRAM IP block 102 in a memory device, where the MRAM diagnostic system 100 is implemented as part of the memory device.

The process begins at operation 402, where the system enters diagnostic mode. The process continues to operation 404, where all bit cells of the MRAM cell array (including all bit cells of any sub-arrays) are preconditioned (or programmed or written) to a data value of 1. For example, controller 104 may instruct MRAM memory controller to write a data value of 1 to all bit cells. The process continues to operation 406, where a predetermined positive magnetic disturb field is applied to the MRAM cell array. For example, controller 104 may send an enable control signal (e.g., turns on current source 106) and a current level selection signal to current source 106, which outputs a corresponding reference current 124 at some predetermined DC current level (based on the selection signal) to signal generator 108. Signal generator 108 receives a direction indication control signal from controller 104 and drives a suitable current signal 126 (based on reference current 124) on one or more antennas 130 to generate a magnetic disturb field.

As discussed above, the magnetic disturb field has a predetermined field strength and polarization. The positive polarization is achieved by directing the current signal through each of the one or more antennas 130 in a first direction, according to the direction indication provided by the controller 104. The magnetic disturb field may be calibrated as part of initialization of operation 406, using one or more sensors 114, which may be located adjacent to and in close vicinity of the MRAM cell array, or may be located with a dedicated calibration antenna. Based on the output of the one or more sensors 114, controller 104 may adjust a present current level of the current signal 126, such as by increasing or decreasing the DC current level output by the current source 106. The adjusted current signal 126 in turn adjusts a present field strength of the magnetic disturb field closer to the predetermined field strength. Once the magnetic disturb field is determined to have the predetermined field strength (or is within an acceptable margin of the predetermined field strength), the magnetic disturb field is held for some short amount of time to disturb the bit cells. Once the time is complete, controller 104 disables the current source 106, and signal generator 108 stops driving the current signal 126 on the one or more antennas 130, which stops generating the positive magnetic disturb field. In some embodiments, controller 104 also includes memory (e.g., a register, buffer, or the like) for storing the present DC current level value as the predetermined current level, to be used for generating the next magnetic disturb field.

The process continues to operation 408, where an ECC read operation is performed on the MRAM cell array. After exposure to the magnetic disturb field, any latent weak bits may have flipped from 1 to 0. The ECC read operations is performed to detect and correct bit errors in the MRAM cell array based on the correction capability of the ECC (e.g., single bit correction, double bit correction, etc.). For example, controller 104 may instruct MRAM memory controller to perform the ECC read operation. If any uncorrectable reads are encountered, such as when more bit errors occur than can be handled by ECC correction, an ECC flag is set (e.g., logic high to indicate an uncorrectable error was found), which is also referred to as setting a fail state.

The process continues to operation 410, which determines whether any uncorrectable reads were found, such as by controller 104 checking whether the ECC flag is set. If any uncorrectable reads were found, the diagnostic mode indicates a failure and the process continues to operation 412, which executes an action to address the failure. For example, controller 104 may determine that a location (such as a sector or word) that contains the uncorrectable read should be retired, and may instruct MRAM memory controller to identify the location as retired. The process then ends (e.g., exiting the diagnostic mode), but may be repeated in order to check the remaining portion of the MRAM cell array, where each ECC read operation avoids any retired locations (such as sectors or words).

In embodiments where the MRAM cell array is implemented as part of a no-fault system, any uncorrectable read indicates an imminent failure condition of the MRAM cell array. As a result, the diagnostic system 100 may be configured to warn the no-fault system, such as an automotive system, of the failure condition as part of operation 412. The no-fault system may take evasive action to prevent an application failure, such as retiring locations that contain an uncorrectable read, switching over to a back-up MRAM cell array (if available), or by disabling or turning off the MRAM cell array as a worse case option.

Returning to operation 410, if no uncorrectable reads are detected, the process continues to operation 414, where a predetermined negative disturb field is applied to the MRAM cell array. For example, controller 104 enables current source 106 and provides the current level selection signal that indicates the predetermined DC current level. Controller 104 also provides a direction indication that is opposite from the direction indication given in operation 406. The negative polarization is achieved by directing the current signal through the antenna(s) 130 in the reverse direction (according to the direction indication), which is a second direction that is opposite the first direction. At this point, the field strength of the magnetic disturb field has already been calibrated. As a result, the negative magnetic disturb field is held for some short amount of time to disturb the bit cells. Once complete, controller 104 disables the current source 106 and signal generator 108 stops driving the current signal 126, which stops generating the negative magnetic disturb field.

The process continues to operation 416, where another ECC read operation is performed on the MRAM cell array, similar to that discussed above in operation 408. The process continues to operation 418, which determines whether any uncorrectable read is found, such as by controller 104 checking whether the ECC flag is set. If any uncorrectable read is found, the diagnostic mode indicates the failure and the process continues to operation 412, which executes an action to address the failure, as described above.

Returning to operation 418, if no uncorrectable reads are detected, the process continues to operation 420, where all bit cells of the MRAM cell array (including all bit cells of any sub-arrays) are preconditioned (or programmed or written) to a data value of 0. For example, controller 104 may instruct MRAM memory controller to write a data value of 0 to all bit cells. The process continues to operation 422, where a predetermined positive magnetic disturb field is applied to the MRAM cell array, similar to the manner described above in operation 406. The positive polarization is achieved by directing the current signal through the antenna(s) 130 in the first direction, as described above. The magnetic disturb field may be calibrated as part of initialization of operation 422, using one or more sensors 114, as also described above in operation 406. Once the magnetic disturb field is determined to have the predetermined field strength, the magnetic disturb field is held for some short amount of time to disturb the bit cells, and then stopped.

The process continues to operation 424, where another ECC read operation is performed on the MRAM cell array, similar to that discussed above in operation 408. After exposure to the magnetic disturb field, any latent weak bits may have flipped from 0 to 1, which are detected during the ECC read operation. The process continues to operation 426, which determines whether any uncorrectable read is found, such as by controller 104 checking whether the ECC flag is set. If any uncorrectable read is found, the diagnostic mode indicates the failure and the process continues to operation 412, which executes an action to address the failure, as described above.

Returning to operation 426, if no uncorrectable reads are detected, the process continues to operation 428, where a predetermined negative disturb field is applied to the MRAM cell array, similar to the manner described above in operation 414. The negative polarization is achieved by directing the current signal through the antenna(s) 130 in a reverse direction, or a second direction that is opposite the first direction. At this point, the field strength of the magnetic disturb field has already been calibrated, and the negative magnetic disturb field is held for some short amount of time to disturb the bit cells, and then stopped.

The process continues to operation 430, where another ECC read operation is performed on the MRAM cell array, similar to that discussed above in operation 408. The process continues to operation 432, which determines whether any uncorrectable read is found, such as by controller 104 checking whether the ECC flag is set. If any uncorrectable read is found, the diagnostic mode indicates a failure and the process continues to operation 412, which executes an action to address the failure, as described above. If no uncorrectable reads were found, the diagnostic mode is passed and the process ends with operation 434, which may include recording the successful diagnostic test in a log (also referred to as setting a pass state). The MRAM system 100 may then return to operational mode.

It is noted that the magnitude of the field strength of the magnetic disturb fields generated in operations 406, 414, 422, and 428 may be the same magnitude. Generally, the first and third magnetic disturb fields have a same polarity (e.g., positive) and the second and fourth magnetic disturb fields have a same polarity that is opposite the first polarity (e.g., negative). The second calibration at operation 422 may be optional in some embodiments, depending on the needs of the system 100.

The active circuitry, including the components of MRAM diagnostic system 100, is formed on a semiconductor substrate such as a wafer that may be singulated in a plurality of die 226, such as by using a sequence of numerous process steps applied to the semiconductor substrate, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like. In some embodiments, the active circuitry may be a combination of the integrated circuit components listed above or may be another type of microelectronic device.

The system 100 may be implemented as an integrated circuit (IC), which may be formed as part of a semiconductor die. The IC may be attached to an underlying carrier substrate such as a microcontroller board or PCB to form part of a memory device, where the carrier substrate includes electrically conductive features on a non-conductive substrate, formed using polyimide or FR4 or BT resin. In some embodiments, the IC may include the system components discussed above in connection with FIG. 1. In other embodiments, the components shown in FIG. 1 may be implemented in multiple separate ICs, which may be attached to and connected to one another through the carrier substrate.

By now it should be appreciated that there has been provided an MRAM diagnostic system configured to identify imminent read failures in an MRAM cell array by applying a predetermined magnetic disturb field and looking for uncorrectable read locations. The diagnostic system may then take evasive actions to prevent a catastrophic application failure, such as retiring the sector or location with the read failure.

In one embodiment of the present disclosure, a method for operating a magnetoresistive random access memory (MRAM) diagnostic system is provided, the method including: preconditioning all bit cells in an MRAM cell array to a data value of one during a diagnostic mode, wherein the MRAM cell array is implemented in an active side of a semiconductor substrate; applying a first magnetic disturb field having a predetermined field strength to the MRAM cell array, subsequent to the preconditioning, wherein the first magnetic disturb field is generated by an antenna implemented in a number of layers of conductive and dielectric material over the active side of the semiconductor substrate; performing a first error correcting code (ECC) read operation to read the MRAM cell array, subsequent to the applying the first magnetic disturb field; and in response to detecting at least one uncorrectable read during the first ECC read operation, setting a fail state and exiting the diagnostic mode.

One aspect of the above embodiment provides that the applying the first magnetic disturb field includes: driving a current signal in a first direction through the antenna, wherein the first magnetic disturb field has a first polarity.

Another aspect of the above embodiment provides that the applying the first magnetic disturb field includes: generating a pulsed current signal according to a predetermined duty cycle at a predetermined frequency, wherein values of the predetermined duty cycle and the predetermined frequency are selected to achieve the pulsed current signal suitable for generating the first magnetic disturb field.

Another aspect of the above embodiment provides that the applying the first magnetic disturb field includes: calibrating the first magnetic disturb field to the predetermined field strength using one or more sensors to detect a present field strength of the first magnetic disturb field, wherein a current level is increased or decreased to respectively increase or decrease the present field strength to the predetermined field strength.

Another aspect of the above embodiment provides that the predetermined field strength is strong enough to disturb a weak bit cell in the MRAM cell array to flip its data value.

Another aspect of the above embodiment provides that the method further includes: in response to detecting the fail state is set, retiring a location containing the uncorrectable read, wherein the first ECC operation avoids reading any retired locations.

Another aspect of the above embodiment provides that the MRAM cell array is one of a number of sub-arrays, and the antenna is one of a number of antennas implemented over a respective sub-array, and each antenna is configured to generate a respective first magnetic disturb field.

A further aspect of the above embodiment provides that the method further includes: in response to detecting no uncorrectable reads during the first ECC read operation, applying a second magnetic disturb field having the predetermined field strength to the MRAM cell array, wherein the second magnetic disturb field is generated by the antenna; performing a second ECC read operation to read the MRAM cell array, subsequent to the applying the second magnetic disturb field; and in response to detecting at least one uncorrectable read during the second ECC read operation, setting the fail state and exiting the diagnostic mode.

A still further aspect of the above embodiment provides that the applying the second magnetic disturb field includes: driving the current signal in a second direction through the antenna that is opposite the first direction, wherein the second magnetic disturb field has a second polarity that is opposite the first polarity.

A yet further aspect of the above embodiment provides that the method further includes: in response to detecting no uncorrectable reads during the second ECC read operation, preconditioning all bit cells in the MRAM cell array to a data value of zero; applying a third magnetic disturb field having the predetermined field strength to the MRAM cell array, subsequent to the preconditioning, wherein the third magnetic disturb field is generated by the antenna; performing a third ECC read operation to read the MRAM cell array, subsequent to the applying the third magnetic disturb field; and in response to detecting at least one uncorrectable read during the third ECC read operation, setting the fail state and exiting the diagnostic mode.

A still yet further aspect of the above embodiment provides that the applying the third magnetic disturb field includes: driving the current signal in the first direction through the antenna, wherein the third magnetic disturb field has the first polarity.

Another still yet further aspect of the above embodiment provides that the applying the third magnetic disturb field includes: calibrating the third magnetic disturb field to the predetermined field strength using one or more sensors to detect a present field strength of the third magnetic disturb field, wherein a current level is increased or decreased to respectively increase or decrease the present field strength to the predetermined field strength.

An even further aspect of the above embodiment provides that the method further includes: in response to determining no uncorrectable reads during the third ECC read operation, applying a fourth magnetic disturb field having the predetermined field strength to the MRAM cell array; performing a fourth ECC read operation to read the MRAM cell array, subsequent to the applying the fourth magnetic disturb field; in response to determining at least one uncorrectable read during the fourth ECC read operation, setting the fail state and exiting the diagnostic mode.

Another even further aspect of the above embodiment provides that the method further includes: in response to determining no uncorrectable reads during the fourth ECC read operation, setting a pass state and exiting the diagnostic mode.

In another embodiment of the present disclosure, a magnetoresistive random access memory (MRAM) diagnostic system is provided, which includes: an MRAM cell array implemented in an active side of a semiconductor substrate; an antenna implemented in a number of layers of conductive and dielectric material over the active side of the semiconductor substrate; a signal generator configured to drive a current signal on the antenna; and a controller configured to: precondition all bit cells in the MRAM cell array to a data value of one during a diagnostic mode, trigger the signal generator to drive the antenna to generate a first magnetic disturb field having a predetermined field strength, perform a first error correcting code (ECC) read operation to read the MRAM cell array, subsequent to the generation of the first magnetic disturb field, and in response to detection of at least one uncorrectable read during the first ECC read operation, set a fail state and exit the diagnostic mode.

One aspect of the above embodiment provides that the MRAM diagnostic system further includes: one or more magnetic field sensors laterally adjacent to the MRAM cell array, wherein each of the one or more magnetic field sensors is configured to output a signal that indicates a field strength of the first magnetic disturb field; and a current source configured to output a reference current to the signal generator; wherein the controller is further configured to: receive a respective signal from the one or more magnetic field sensors, make a determination whether a present field strength of the first magnetic disturb field should be adjusted to in order to achieve the predetermined field strength, and adjust a present current level of the reference current, according to the determination.

Another aspect of the above embodiment provides that the controller is further configured to: in response to detection of no uncorrectable reads during the first ECC read operation, trigger the signal generator to drive the antenna to generate a second magnetic disturb field having the predetermined field strength; perform a second ECC read operation to read the MRAM cell array, subsequent to generation of the second magnetic disturb field; and in response to detection of at least one uncorrectable read during the second ECC read operation, set the fail state and exit the diagnostic mode.

A further aspect of the above embodiment provides that the controller is further configured to: in response to detection of no uncorrectable reads during the second ECC read operation, precondition all bit cells in the MRAM cell array to a data value of zero; rigger the signal generator to drive the antenna to generate a third magnetic disturb field having the predetermined field strength; perform a third ECC read operation to read the MRAM cell array, subsequent to generation of the third magnetic disturb field; and in response to detection of at least one uncorrectable read during the third ECC read operation, set the fail state and exit the diagnostic mode.

A still further aspect of the above embodiment provides that the controller is further configured to: in response to detection of no uncorrectable reads during the third ECC read operation, trigger the signal generator to drive the antenna to generate a fourth magnetic disturb field having the predetermined field strength; perform a fourth ECC read operation to read the MRAM cell array, subsequent to generation of the fourth magnetic disturb field; and in response to detection of at least one uncorrectable read during the fourth ECC read operation, set the fail state and exit the diagnostic mode.

A yet further aspect of the above embodiment provides that the signal generator is configured to drive the current signal on the antenna in a first direction to generate a first polarity magnetic disturb field, the signal generator is further configured to drive the current signal on the antenna in a second direction opposite the first direction to generate a second polarity magnetic disturb field, the second polarity opposite the first polarity, the first and third magnetic disturb fields have the first polarity, and the second and fourth magnetic disturb fields have the second polarity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

In some embodiments, switches may be implemented using one or more transistors, such as n-channel or p-channel transistors, or other suitable switching devices. The switch control signals are each configured to open or close the respective switch (e.g., to close the switch by making it conductive and complete the path between the first and second terminals of the switch, or to open the switch by making the switch nonconductive and break the path between the first and second terminals of the switch).

It is noted that the term "neighboring" as used herein means "adjacent to" (e.g., next to and without an intervening object), and "laterally" as used herein means "in a sideways direction" (e.g., a horizontal direction that is parallel to a plane of the substrate).

As used herein, the terms "substantial" and "substantially" mean sufficient to achieve the stated purpose or value in a practical manner, taking into account any minor imperfections or deviations, if any, that arise from usual and expected process abnormalities that may occur during operation, which are not significant for the stated purpose or value. Also as used herein, the terms "approximately" and "about" mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. For example, additional or fewer sensors may be implemented in FIG. 3. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for operating a magnetoresistive random access memory (MRAM) diagnostic system, the method comprising:

preconditioning all bit cells in an MRAM cell array to a data value of one during a diagnostic mode, wherein the MRAM cell array is implemented in an active side of a semiconductor substrate;

applying a first magnetic disturb field having a predetermined field strength to the MRAM cell array, subsequent to the preconditioning, wherein the first magnetic disturb field is generated by an antenna implemented in a number of layers of conductive and dielectric material over the active side of the semiconductor substrate;
performing a first error correcting code (ECC) read operation to read the MRAM cell array, subsequent to the applying the first magnetic disturb field; and
in response to detecting at least one uncorrectable read during the first ECC read operation, setting a fail state and exiting the diagnostic mode.

2. The method of claim 1, wherein
the applying the first magnetic disturb field comprises:
driving a current signal in a first direction through the antenna, wherein the first magnetic disturb field has a first polarity.

3. The method of claim 1, wherein
the applying the first magnetic disturb field comprises:
generating a pulsed current signal according to a predetermined duty cycle at a predetermined frequency, wherein values of the predetermined duty cycle and the predetermined frequency are selected to achieve the pulsed current signal suitable for generating the first magnetic disturb field.

4. The method of claim 1, wherein
the applying the first magnetic disturb field comprises:
calibrating the first magnetic disturb field to the predetermined field strength using one or more sensors to detect a present field strength of the first magnetic disturb field, wherein a current level is increased or decreased to respectively increase or decrease the present field strength to the predetermined field strength.

5. The method of claim 1, wherein
the predetermined field strength is strong enough to disturb a weak bit cell in the MRAM cell array to flip its data value.

6. The method of claim 1, further comprising:
in response to detecting the fail state is set, retiring a location containing the uncorrectable read, wherein the first ECC operation avoids reading any retired locations.

7. The method of claim 1, wherein
the MRAM cell array is one of a number of sub-arrays, and
the antenna is one of a number of antennas implemented over a respective sub-array, and
each antenna is configured to generate a respective first magnetic disturb field.

8. The method of claim 2, further comprising:
in response to detecting no uncorrectable reads during the first ECC read operation, applying a second magnetic disturb field having the predetermined field strength to the MRAM cell array, wherein the second magnetic disturb field is generated by the antenna;
performing a second ECC read operation to read the MRAM cell array, subsequent to the applying the second magnetic disturb field; and
in response to detecting at least one uncorrectable read during the second ECC read operation, setting the fail state and exiting the diagnostic mode.

9. The method of claim 8, wherein
the applying the second magnetic disturb field comprises:
driving the current signal in a second direction through the antenna that is opposite the first direction, wherein the second magnetic disturb field has a second polarity that is opposite the first polarity.

10. The method of claim 9, further comprising:
in response to detecting no uncorrectable reads during the second ECC read operation, preconditioning all bit cells in the MRAM cell array to a data value of zero;
applying a third magnetic disturb field having the predetermined field strength to the MRAM cell array, subsequent to the preconditioning, wherein the third magnetic disturb field is generated by the antenna;
performing a third ECC read operation to read the MRAM cell array, subsequent to the applying the third magnetic disturb field; and
in response to detecting at least one uncorrectable read during the third ECC read operation, setting the fail state and exiting the diagnostic mode.

11. The method of claim 10, wherein
the applying the third magnetic disturb field comprises:
driving the current signal in the first direction through the antenna, wherein the third magnetic disturb field has the first polarity.

12. The method of claim 10, wherein
the applying the third magnetic disturb field comprises:
calibrating the third magnetic disturb field to the predetermined field strength using one or more sensors to detect a present field strength of the third magnetic disturb field, wherein a current level is increased or decreased to respectively increase or decrease the present field strength to the predetermined field strength.

13. The method of claim 11, further comprising:
in response to determining no uncorrectable reads during the third ECC read operation, applying a fourth magnetic disturb field having the predetermined field strength to the MRAM cell array;
performing a fourth ECC read operation to read the MRAM cell array, subsequent to the applying the fourth magnetic disturb field;
in response to determining at least one uncorrectable read during the fourth ECC read operation, setting the fail state and exiting the diagnostic mode.

14. The method of claim 13, further comprising:
in response to determining no uncorrectable reads during the fourth ECC read operation, setting a pass state and exiting the diagnostic mode.

15. A magnetoresistive random access memory (MRAM) diagnostic system comprising:
an MRAM cell array implemented in an active side of a semiconductor substrate;
an antenna implemented in a number of layers of conductive and dielectric material over the active side of the semiconductor substrate;
a signal generator configured to drive a current signal on the antenna; and
a controller configured to:
precondition all bit cells in the MRAM cell array to a data value of one during a diagnostic mode,
trigger the signal generator to drive the antenna to generate a first magnetic disturb field having a predetermined field strength,
perform a first error correcting code (ECC) read operation to read the MRAM cell array, subsequent to the generation of the first magnetic disturb field, and
in response to detection of at least one uncorrectable read during the first ECC read operation, set a fail state and exit the diagnostic mode.

16. The MRAM diagnostic system of claim 15, further comprising:
one or more magnetic field sensors laterally adjacent to the MRAM cell array, wherein each of the one or more magnetic field sensors is configured to output a signal that indicates a field strength of the first magnetic disturb field; and
a current source configured to output a reference current to the signal generator; wherein
the controller is further configured to:
receive a respective signal from the one or more magnetic field sensors,
make a determination whether a present field strength of the first magnetic disturb field should be adjusted to in order to achieve the predetermined field strength, and
adjust a present current level of the reference current, according to the determination.

17. The MRAM diagnostic system of claim 15, wherein the controller is further configured to:
in response to detection of no uncorrectable reads during the first ECC read operation, trigger the signal generator to drive the antenna to generate a second magnetic disturb field having the predetermined field strength;
perform a second ECC read operation to read the MRAM cell array, subsequent to generation of the second magnetic disturb field; and
in response to detection of at least one uncorrectable read during the second ECC read operation, set the fail state and exit the diagnostic mode.

18. The MRAM diagnostic system of claim 17, wherein the controller is further configured to:
in response to detection of no uncorrectable reads during the second ECC read operation, precondition all bit cells in the MRAM cell array to a data value of zero;
trigger the signal generator to drive the antenna to generate a third magnetic disturb field having the predetermined field strength;
perform a third ECC read operation to read the MRAM cell array, subsequent to generation of the third magnetic disturb field; and
in response to detection of at least one uncorrectable read during the third ECC read operation, set the fail state and exit the diagnostic mode.

19. The MRAM diagnostic system of claim 18, wherein the controller is further configured to:
in response to detection of no uncorrectable reads during the third ECC read operation, trigger the signal generator to drive the antenna to generate a fourth magnetic disturb field having the predetermined field strength;
perform a fourth ECC read operation to read the MRAM cell array, subsequent to generation of the fourth magnetic disturb field; and
in response to detection of at least one uncorrectable read during the fourth ECC read operation, set the fail state and exit the diagnostic mode.

20. The MRAM diagnostic system of claim 19, wherein the signal generator is configured to drive the current signal on the antenna in a first direction to generate a first polarity magnetic disturb field,
the signal generator is further configured to drive the current signal on the antenna in a second direction opposite the first direction to generate a second polarity magnetic disturb field, the second polarity opposite the first polarity,
the first and third magnetic disturb fields have the first polarity, and
the second and fourth magnetic disturb fields have the second polarity.

* * * * *